(12) United States Patent
Hendrickson et al.

(10) Patent No.: US 6,257,827 B1
(45) Date of Patent: *Jul. 10, 2001

(54) APPARATUS AND METHOD FOR TRANSPORTING SUBSTRATES

(75) Inventors: Ruth Ann Hendrickson, Lincoln; Peter F. Van der Meulen, Newburyport, both of MA (US)

(73) Assignee: Brooks Automation Inc., Chelmford, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/089,752

(22) Filed: Jun. 2, 1998

Related U.S. Application Data

(60) Provisional application No. 60/067,036, filed on Dec. 1, 1997.

(51) Int. Cl.[7] .................................................. B65G 49/07
(52) U.S. Cl. ........................ 414/805; 414/811; 414/217; 414/217.1; 414/937; 414/939
(58) Field of Search .................... 414/217, 217.1, 414/416, 805, 811, 937, 939; 118/719

(56) References Cited

U.S. PATENT DOCUMENTS

| | | | |
|---|---|---|---|
| 4,801,241 | * | 1/1989 | Zajac et al. ............................ 414/805 |
| 4,836,733 | * | 6/1989 | Hertel et al. ......................... 414/744.5 |
| 4,915,564 | * | 4/1990 | Eror et al. .......................... 414/939 X |
| 5,310,410 | * | 5/1994 | Begin et al. ........................ 414/217 X |
| 5,445,491 | * | 8/1995 | Nakagawa et al. ............... 414/939 X |
| 5,451,130 | * | 9/1995 | Kempf ................................. 414/217 X |
| 5,460,478 | * | 10/1995 | Akimoto et al. ....................... 414/811 |
| 5,474,641 | * | 12/1995 | Otsuki et al. ....................... 414/939 X |
| 5,486,080 | * | 1/1996 | Sieradzki ............................ 414/805 X |
| 5,509,771 | * | 4/1996 | Hiroki ................................ 414/939 X |
| 5,655,060 | * | 8/1997 | Lucas .................................. 901/19 X |
| 5,668,733 | * | 9/1997 | Morimoto et al. ............... 414/937 X |
| 5,700,127 | * | 12/1997 | Harada et al. .................... 414/811 X |
| 5,820,679 | * | 10/1998 | Yokoyama et al. .............. 414/937 X |
| 5,863,170 | * | 1/1999 | Boitnott et al. .................. 414/937 X |
| 5,900,105 | * | 5/1999 | Toshima ............................ 414/939 X |
| 5,975,740 | * | 11/1999 | Lin et al. .......................... 414/939 X |

\* cited by examiner

*Primary Examiner*—Eileen D. Lillis
*Assistant Examiner*—Thuy V. Tran
(74) *Attorney, Agent, or Firm*—Perman & Green, LLP

(57) ABSTRACT

A method and apparatus for substrate processing at lower cost than existing processing systems are disclosed, which by implementing an arrangement using load locks of smaller dimensions or of a non-indexing type, as compared to existing large dimension or indexing load locks, along with a substrate loading and unloading technique can achieve the fast throughput of existing systems while reducing the size and cost of the load lock apparatus required. A processed substrate is returned by an internal robot from one of its processing modules to the shelf or slot in the small load lock from which the last substrate was removed for processing by the robot, rather than being returned to the original source shelf or slot from which it was removed for processing, as in the prior art. Also venting for a first one of the load locks is started as soon as the second load lock becomes the substrate source for the internal robot rather than waiting until the first load lock has been refilled with processed substrates. By virtue of these improved operations, small dimension load locks, whether of the indexing or non-indexing type, can be used in place of more expensive large dimension indexing type load locks while maintaining comparable substrate throughputs.

11 Claims, 8 Drawing Sheets

APPARATUS AND METHOD FOR TRANSPORTING SUBSTRATES

CLAIM OF PRIORITY BASED ON CO-PENDING PROVISIONAL APPLICATION

The present application is related to co-pending Provisional patent application Ser. No. 60/067,036 of Ruth A. Hendrickson and Peter F. Van Der Meulen, filed Dec. 1, 1997, entitled "APPARATUS AND METHOD ° FOR TRANSPORTING SUBSTRATES", and based on which priority is herewith claimed under 35 U.S.C. 119(e) and the disclosure of which is incorporated herein by reference in its entirety.

BACKGROUND OF THE INVENTION

1. Field of the Invention

The present invention relates to transporting substrates and, more particularly, to moving substrates into and out of areas with limited individual holding areas.

2. Prior Art

Substrate processing apparatus, commonly referred to as cluster tools, are known that include a module for supplying substrates from the exterior into a main processing section or chamber from which they are transferred into substrate processing modules communicating with the main section. The main chamber may be maintained in a vacuum and has a substrate transport for moving substrates among the processing modules, which transport may be of the type of transfer device described in PCT patent publication No. WO 94/23911. The processing modules may be of various forms familiar to the art. The substrate supply module is connected to a front end of the main section and typically has a frame, a substrate transport, and means for holding two substrate cassettes. The front end of the main section has two load locks that function as compartments for transporting the substrates between the vacuum chamber and the supply module 16, i.e., between a vacuum environment and an atmospheric pressure environment. An external or atmospheric robot transports the substrates from the cassettes to the load locks, and an internal or vacuum chamber robot transports the substrates from the load locks to the processing modules. When the substrate processing is finished, the vacuum chamber robot transports the substrates from the processing modules back to the load locks and the atmospheric robot transports the substrates from the load locks back to the cassettes. Typically, the load locks are indexing load locks which have numerous substrate support shelves and an elevator mechanism to move the shelves up and down. The shelves in the load locks may be as many as 30, depending upon the corresponding number of substrates held in a single cassette. The external robot loads a full cassette of substrates into each load lock. The internal robot loads and unloads the substrates between the load locks and the processing modules and then returns the processed substrates back to their cassettes. In the prior art apparatus, a computer controller is programmed to move the vacuum robots such that a substrate moved from a first location, such as a shelf in one of the the load locks, will be returned to the same location after being transported to a second location. Recently, substrate processing apparatus are being manufactured to process newer larger substrates, such as 300 mm diameter semiconductor wafers or flat panel display substrates which could be as large as a square meter. Indexing load locks for such large substrates can hold a large quantity of substrates and have the advantage of providing very good substrate throughput. Large size substrates must also be relatively slowly exposed to environmental change in the load locks in order to prevent undesired effects such as vapor condensation on the substrates. Indexing load locks are again of advantage as they can effectively compensate or the longer load lock environment change time to retain good substrate throughput. However, indexing load locks are very expensive, and thus a problem is presented regarding how to maintain good substrate throughput, but nonetheless reduce the costs associated with large substrate indexing load locks.

3. Object

It is therefore an object of the present invention to provide a substrate processing apparatus which can achieve a comparable substrate throughput to that of an apparatus with large substrate indexing load locks while being of considerably lower cost.

SUMMARY OF THE INVENTION

The present invention embodies a method and apparatus for substrate processing at lower cost than existing systems that use large dimension or indexing load locks, by implementing an arrangement using load locks of smaller dimensions or of a non-indexing type, along with a substrate loading and unloading technique that maintains the fast throughput while reducing the size and cost of the load lock apparatus required. In accordance with the invention, a processed substrate is returned by the internal robot from one of the processing modules to the shelf or slot in the load lock from which the last substrate was removed for processing by the robot, rather than being returned to the original source shelf or slot from which it was removed for processing, as in the prior art. Also venting for a first one of the load locks can start as soon as the second load lock becomes the substrate source for the internal robot rather than waiting until the first load lock has been refilled with processed substrates. By virtue of these improved operations, small dimension load locks, whether of the indexing or non-indexing type, can be used in place of more expensive large dimension indexing type load locks while maintaining comparable substrate throughputs.

BRIEF DESCRIPTION OF THE DRAWINGS

The foregoing aspects and other features of the present invention are explained in the following description, taken in connection with the accompanying drawings, wherein:

FIG. 4 is a schematic view of general components which the present invention can be used with;

DETAILED DESCRIPTION OF THE PREFERRED EMBODIMENT

Figure 1:
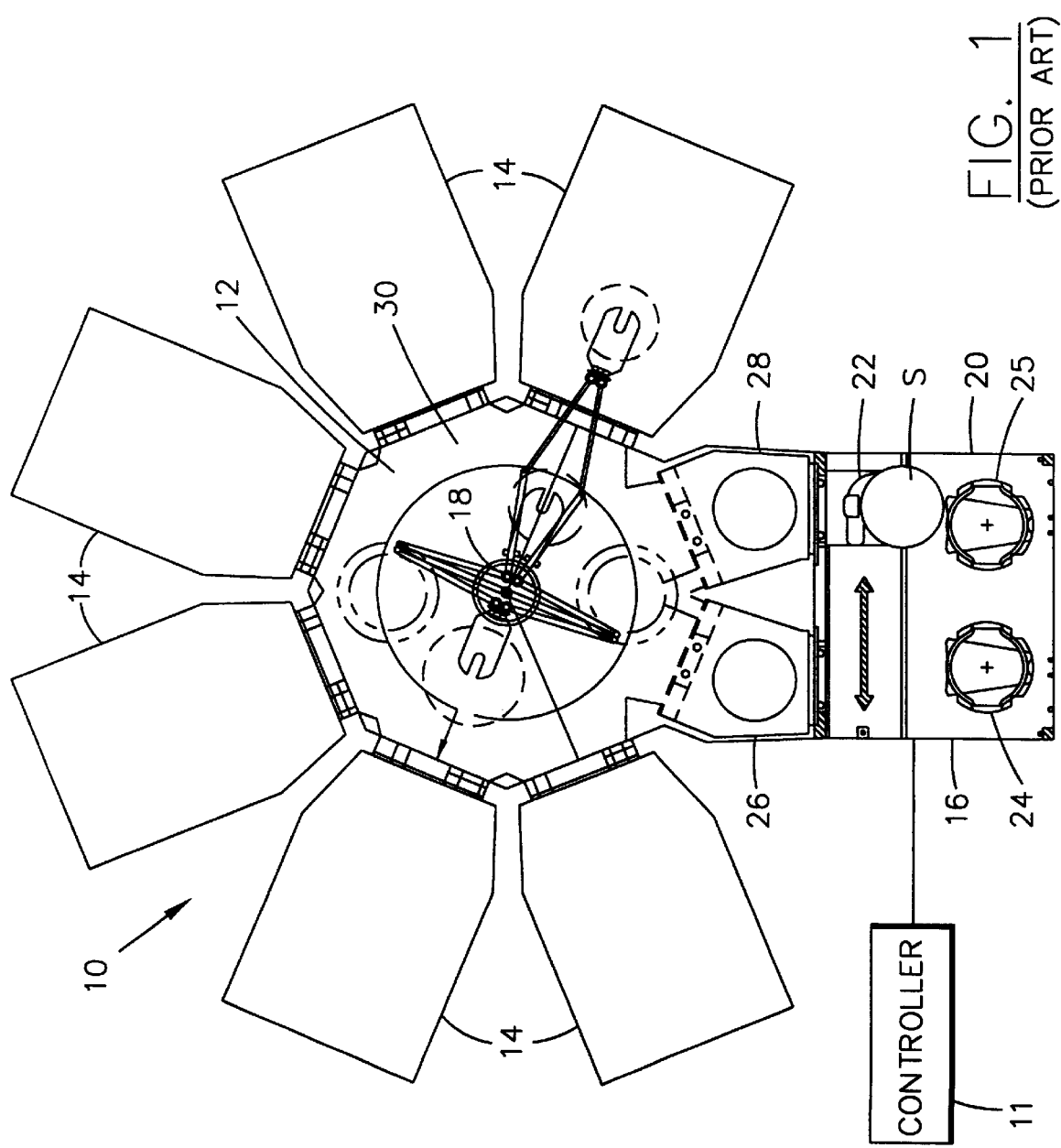
FIG. 1 is a schematic top plan view of a prior art substrate processing apparatus or cluster tool.

Referring to FIG. 1, there is shown a schematic top plan view of a prior art substrate processing apparatus 10 or, as commonly referred to, a cluster tool. The apparatus 10 includes a main section 12, substrate processing modules 14 and a substrate supply module 16. The main section 12 has a substrate transport 18 for moving substrates among the modules 14, 16. The substrate transport 18 is substantially the same as the transfer device described in PCT patent publication No. WO 94/23911 which is hereby incorporated by reference in its entirety. However, any suitable type of transport could be used. The chamber 30 formed by the main section 12 is preferably maintained in a vacuum. The substrate supply module 16 is connected to a front end of the main section 12. The supply module 16 has a frame 20, a substrate transport 22, and means for holding two substrate cassettes 24, 25. However, in alternate embodiments, any suitable type of substrate supply module could be provided. The substrate processing modules 14 are well known in the art and, therefore, will not be described further.

The front end of the main section 12 has two load locks 26, 28. The load locks function as compartments for transporting the substrates between the vacuum chamber 30 and the supply module 16; namely, between a vacuum environment and an atmospheric pressure environment. The atmospheric robot 22 transports the substrates from the cassettes 24, 25 to the load locks 26, 28. The vacuum chamber robot 18 transports the substrates from the load locks 26, 28 to the processing modules 14. Similarly, when the substrates are finished being processed, the vacuum chamber robot 18 transports the substrates from the modules 14 to the load locks 26, 28 and, the atmospheric robot 22 transports the substrates from the load locks 26, 28 back to the cassettes 24, 25.

Typically, the load locks 26, 28 are indexing load locks. Indexing load locks have numerous substrate support shelves and an elevator mechanism to move the shelves up and down. The shelves in the load locks could be as many as 13, 25, or 30, preferably corresponding to the number of substrates held in a single cassette 24, 25. The atmospheric robot 22 loads a full cassette of substrates into each load lock. The vacuum chamber robot 18 loads and unloads the substrate between the load locks 26, 28 and the modules 14. The atmospheric robot 22 then returns the processed substrates back to their cassettes 24, 25. In the prior art, the computer controller 11 was programmed to move the robots 18, 22 such that a substrate moved from a first location, such as a shelf in one of the cassette 24, 25 or a shelf in one of the load locks 26, 28, would be returned to the same location after being transported to a second location.

Recently, substrate processing apparatus are being manufactured for newer larger substrates, such as 300 mm diameter semiconductor wafers and flat panel display substrates which could be as large as 2 feet square. Indexing load locks for such large substrates are very expensive. However, indexing load locks have the advantage of providing very good substrate throughput. Large size substrates must also be relatively slowly exposed to environmental change in the load locks in order to prevent undesired effects on the large size substrates, such as vapor condensation on the substrates. Indexing load locks, which can hold a large quantity of substrates can effectively compensate for the longer load lock environment change time to retain a good substrate throughput. Thus, a problem existed regarding how to maintain good substrate throughput, but nonetheless reduce the costs associated with large substrate indexing load locks.

Figure 2:
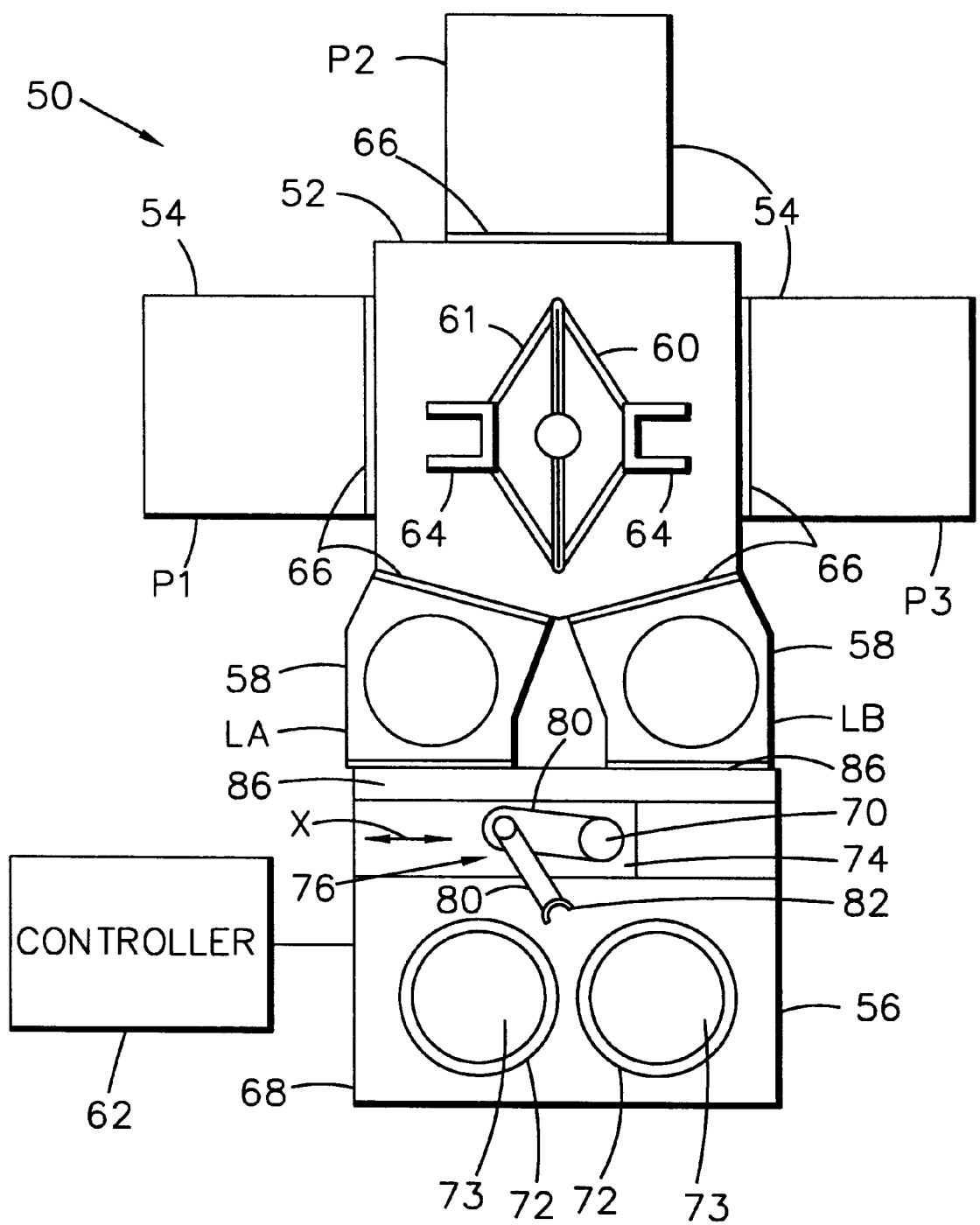
FIG. 2 is a schematic top plan view of a substrate processing apparatus comprising features of the present invention.

Referring now to FIG. 2, a schematic top view of a substrate processing apparatus 50 incorporating features of the present invention is shown. Although the present invention will be described with reference to the single embodiment shown in the drawings, it should be understood that the present invention can be embodied in many alternate forms of embodiments. In addition, any suitable size, shape or type of elements or materials could be used. The apparatus 50 includes a main section 52, substrate processing modules 54, a substrate supply section 56 and load locks 58 connecting the main section 52 to the supply section 56. The apparatus 50 also includes a computer controller 62. In the embodiment shown, the apparatus 50 has three of the substrate processing modules 54; separately numbered P1, P2, P3. The apparatus 50 also has two of the load locks 58; separately labeled LA and LB. The main section 52 is preferably maintained in a vacuum or inert gas environment. The main section robot 60 has two end effectors 64 for individually supporting two separate substrates thereon. The main section robot 60 can move substrates between or among the various processing modules P1, P2, P3 and load locks LA, LB. Preferably, the main section robot 60 is also adapted to vertically move the end effectors 64 up and down by moving the movable arm assembly 61 up and down. Doors 66 are provided between the main section 52 and the substrate processing modules 54 and load locks 58.

Figure 3:
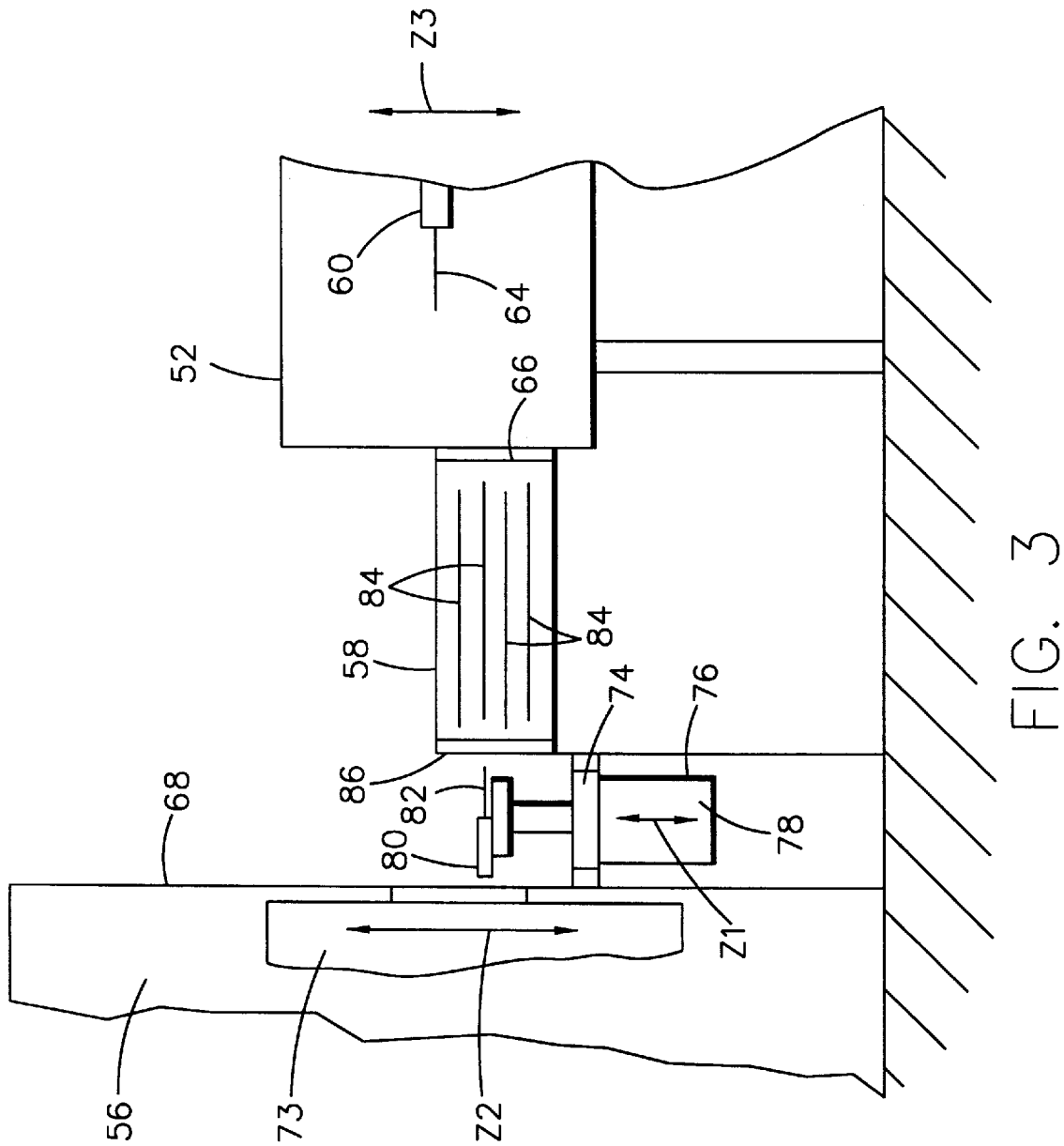
FIG. 3 is a partial schematic side view of one of the load lock areas of the apparatus shown in FIG. 2.

The substrate supply section 56 includes a frame 68, an atmospheric substrate transport mechanism 70, and substrate cassette holders 72. The transport mechanism 70 includes a car 74 movably mounted on rails of the frame 68 for linear movement on the rails as indicated by arrow X. The transport mechanism 70 also includes a robot 76 mounted to the car 74. Referring also to FIG. 3, the atmospheric robot 76 has a drive system 78, a movable arm assembly 80 connected to the drive system 78, and an end effector 82 attached to the end of the movable arm assembly 80. In the embodiment shown, the movable arm assembly is a scara arm assembly. In the embodiment shown, the end effector is adapted to individually move only one substrate at a time. However, in alternate embodiments, the end effector could be sized and shaped to move multiple substrates at the same time. In other alternate embodiments, any suitable atmospheric substrate transport mechanism could be provided. In the embodiment shown the drive system 78 is adapted to vertically move the movable arm assembly 80 and the end effector 82 as indicated by arrow $Z_1$. The substrate cassette holders 72 are adapted to vertically move the cassettes 73 relative to the frame 68 as indicated by arrow $Z_2$.

The load locks 58 are non-indexing load locks. In other words, the load locks do not have an elevator mechanism to vertically move substrates in the load locks up and down. The load locks each have four stationary substrate support shelves 84. In alternate embodiments any suitable number of support shelves in the load locks could be provided, including only one shelf. However, with the non-indexing load locks, the number of shelves is generally limited to their relative spacing and the amount of vertical movement $Z_1$, and $Z_3$ available to the two robots 76, 60. Doors 86 are provided at the atmospheric section side of the load locks. By providing the load locks 58 as a non-indexing type, a significant cost saving is obtained. For applications where the locks separate a vacuum environment from an atmospheric environment, the equalization cycle whereby the load lock is vented to atmospheric pressure or pumped to the required vacuum pressure must be done slowly to avoid transporting particles onto the substrate surfaces from turbulent gas flow or moisture condensation. For controlled atmospheric environments, the purge rate flow must be slow enough to avoid turbulence. For thermal equilibration, larger size substrates generally need to be exposed to environmental changes at a slower rate than smaller size substrates. Because the number of substrates which a non-indexing type load lock holds is significantly less than the number of substrates which an indexing type load lock can hold, substrate throughput would be expected to be significantly less when using the non-indexing type load locks. However, to overcome this problem, the present invention uses a new method to load substrates into the load locks 58 and unload substrates from the load locks.

As noted above, the apparatus 50 has a controller 62. The controller 62 preferably comprises a computer. The controller 62 is operably connected to the two robots 60, 76, the doors 66, 86, the transport mechanism 70, the movable substrate cassette holders 72, and the processing modules 54 to control their functions. A unique feature of the present invention is that a processed substrate is returned by the robot 60 from one of the processing modules 54 to the shelf or slot 84 of the last substrate removed from the load lock by the robot 60 rather than to the processed substrate's original source shelf or slot 84.

Another unique feature is that venting for a first one of the load locks can start as soon as the second load lock becomes the substrate source for the robot 60 rather than waiting until the first load lock has been refilled with processed substrates.

Figure 3A:
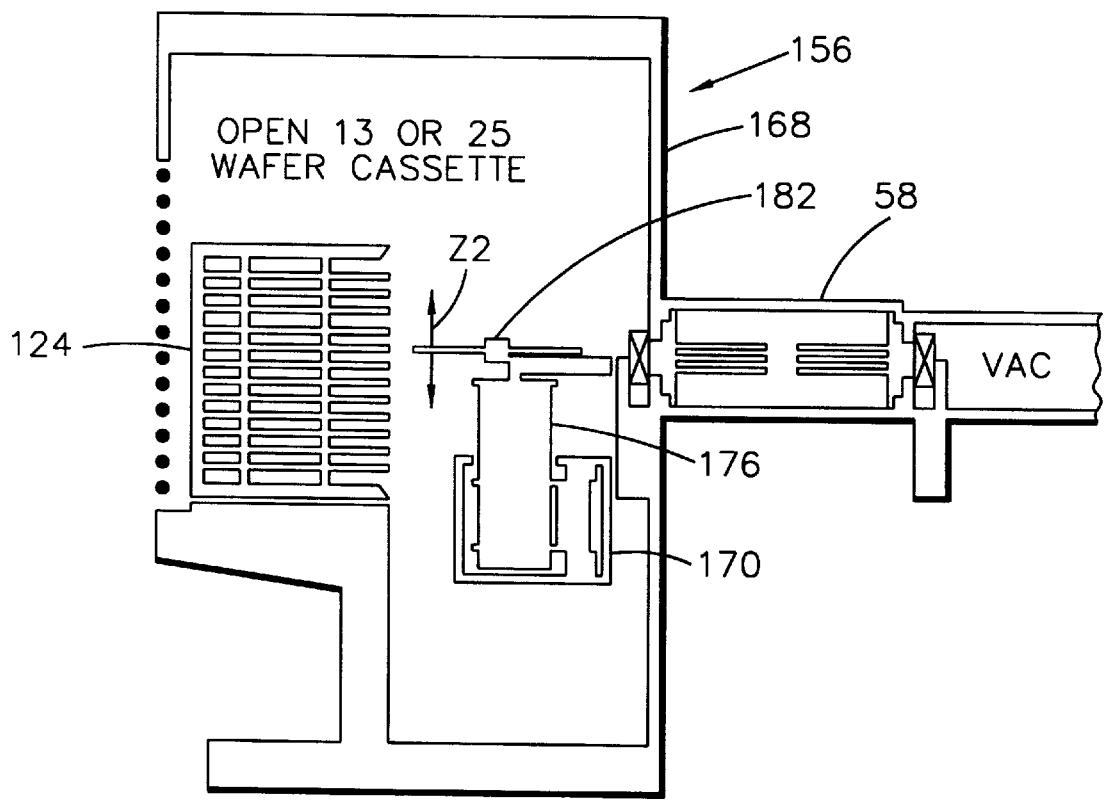
FIG. 3A is a partial schematic side view of the load lock area and substrate supply section of an alternate embodiment.
Figure 3B:
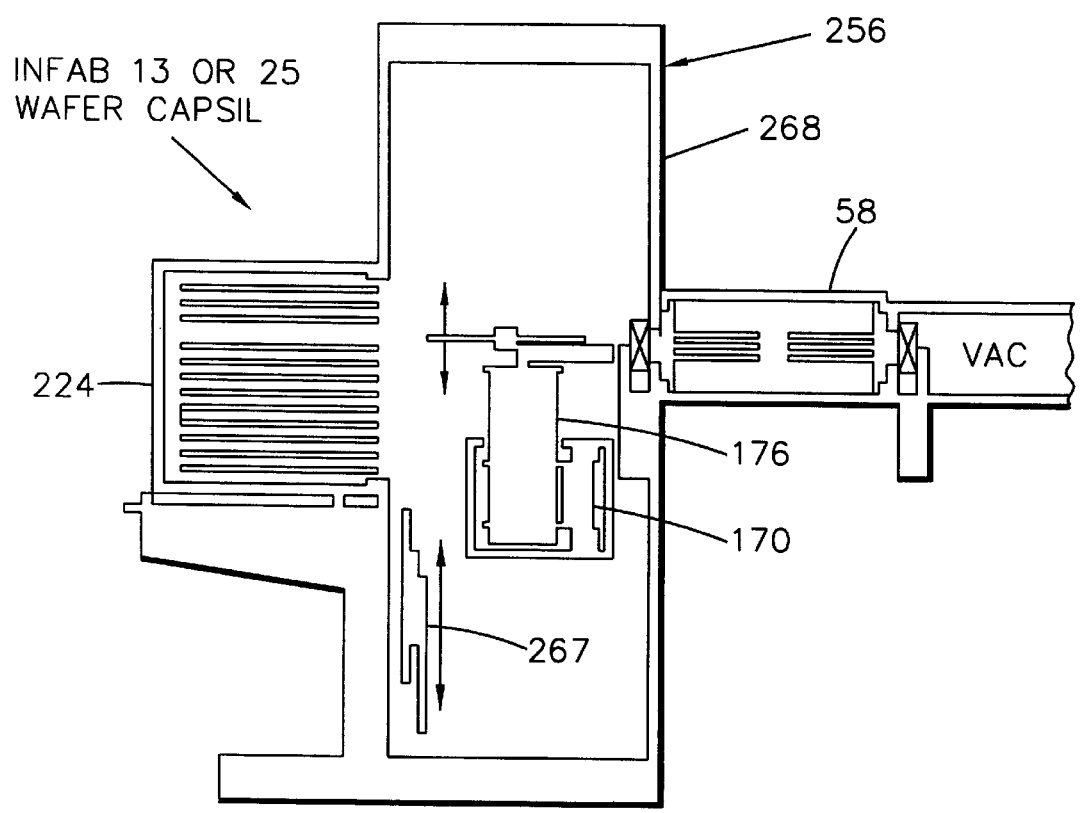
FIG. 3B is a partial schematic side view of the load lock area and substrate supply section of another alternate embodiment.

Referring also to FIGS. 3A and 3B, two alternate embodiments of the substrate supply section are shown connected to the load lock 58. In FIG. 3A, the supply section 156 has the transport mechanism 170 with robot 176. The cassette 124 is stationarily, but removably mounted to the frame 168. The cassette 124 could be an open 13 or 25 wafer cassette. The robot 176 can vertically move its end effector 182 as indicated by arrow $Z_2$ to load and unload substrates between the cassette 124 and the load lock 58. In FIG. 3B the supply section 256 has the same transport mechanism 170 with robot 176. The cassette 224 is a Front Opening Universal Pod (FOUP), such as an Infab 13 or 25 wafer capsil which is stationarily, but removably mounted to the frame 268. The frame 268 includes a movable door 267 that can be moved up and down when the wafer capsil 224 is changed.

Figure 4:
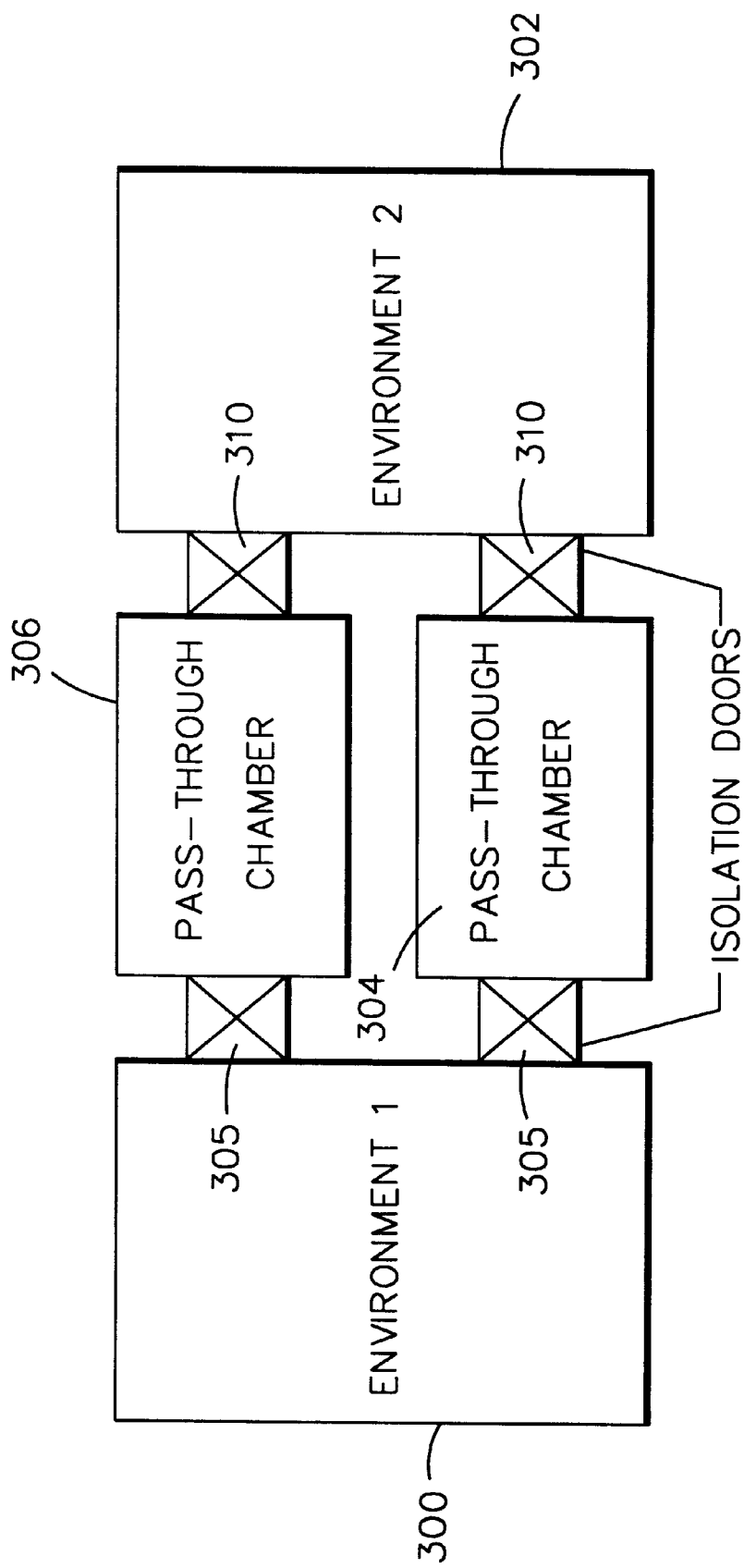

FIG. 4 shows one of the most basic adaptations for the present invention. The first environment 300 and the second environment 302 could be two transport chambers, such as the main section 12 shown in FIG. 1, or one of the main sections 12 and an atmospheric section. The pass-through chambers 304, 306 have one or more positions for holding material. Each pass-through chamber has two doors 308, 310 that serve to isolate the pass-through chamber from the two environments. For example, one door might open to a standard semiconductor clean room; the other might open to a semiconductor vacuum transport chamber. Because the pass-through chamber connects the two different environments, the environment in the pass-through chamber must change to match the environment in the neighboring chamber before the isolation door opens. Consequently, the pass-through chamber is often called a pass-through lock or load lock.

A certain period of time must pass to equalize the environment in the pass-through chamber to the neighboring environment before the isolation door can be opened. The amount of material that can move through the pass-through chamber in a given time period is called "throughput". To maximize throughput, the pass-through chambers are used in an alternating mode; one pass-through chamber will be receiving or sending material while the other pass-through chamber is equalizing. If the equalization time is short enough, one pass-through chamber may finish equalizing before the other finishes accepting or sending material. In that case, the equalization activity is "in the background", and therefore does not inhibit throughput.

Typically, material handling robots move the material from one environment, through the pass-through chamber, and into the second environment. One material handling robot moves wafers from the first environment into the pass-through chamber; a second robot moves wafers from the pass-through chamber into a second environment. In practice, both the second and the first environments may have more than one handling robot.

Figure 5:
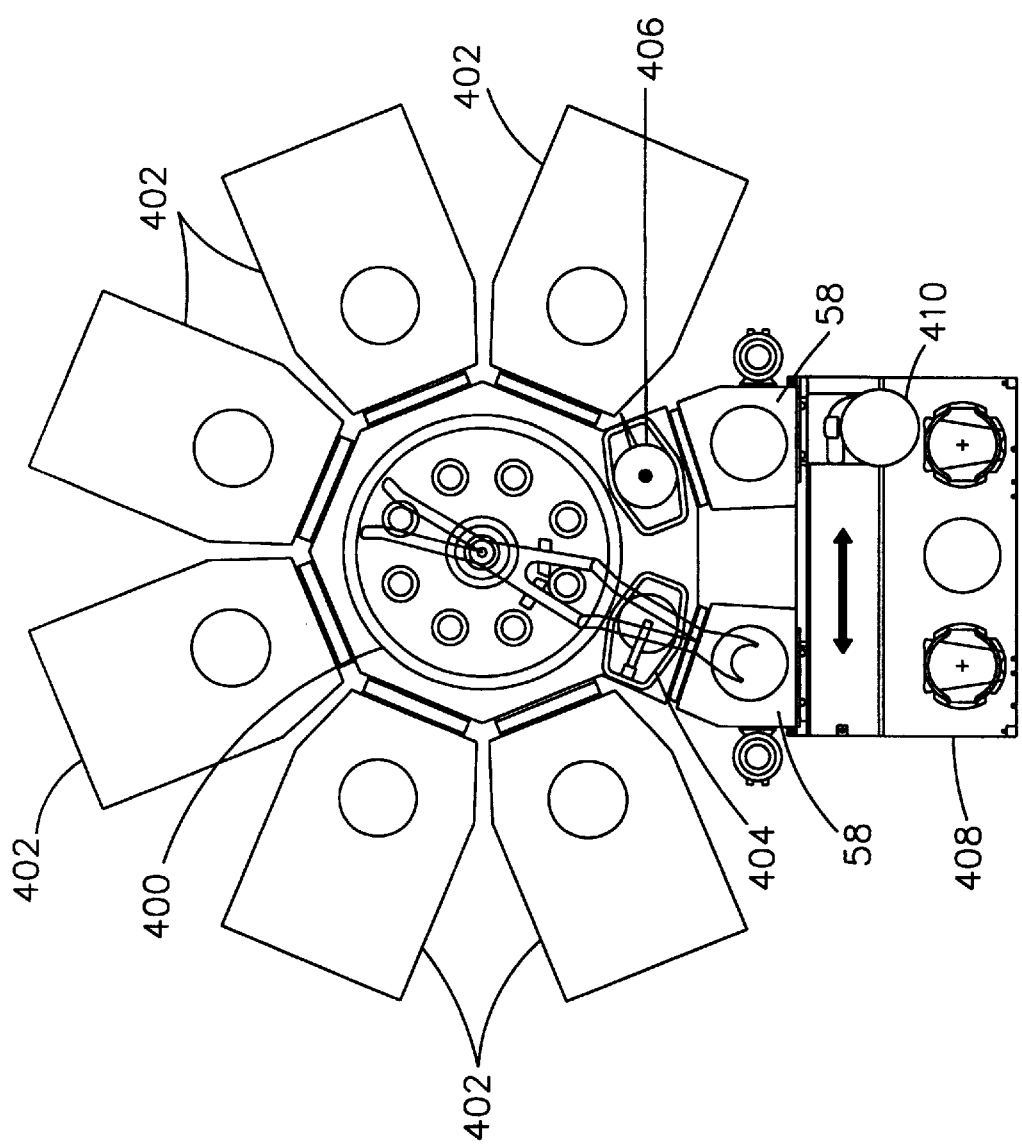
FIG. 5 is a schematic top plan view of another alternate embodiment of the invention.

FIG. 5 shows another alternate of the present invention. The main section 400 has more than three processing modules 402 attached to it. The main section 400 also has a substrate aligner 404 and a substrate cooler 406 located in paths to the load locks 58. The substrate supply section 408 also includes a substrate buffer 410 between two cassettes. The present invention could be used with any suitable type of substrate processing apparatus.

The material moved includes, but is not limited to, wafers, substrates, and glass panels. The controlled environment includes, but is not limited to, vacuum (significantly less than atmospheric pressure), near atmospheric pressure but with controlled gas constituents, or any pressure with controlled temperature. The movement of the robot and the material is under the control of "scheduling" software. The presently described method pertains to the scheduling algorithm for this material movement.

In order to optimize the total tool throughput, using a substrate processing apparatus or cluster tool in accordance with the present invention, e.g., as shown in FIG. 2, the following exemplary scheduling algorithm may be followed for scheduling through two alternating pass through locks LA and LB. The preferred steps are set forth for a single-pan i.e., single holder or end effector, robot and a dual-pan robot.

EXAMPLES

| Assume | Key | |
|---|---|---|
| Two 4 slot pass through locks | LAn | Lock A, shelf n |
| 3 parallel PMs | LBn | Lock B, shelf n |
| 10 substrates in cassette | Pn | Process Module n |
| Batch of 1 cassette to be processed | w1 | substrate 1 |
| | pk | pick up |
| | pl | place |
| | phm | pump, home, map |
| | F1 cycle | vent, empty and refill, pump, home, map |

EXAMPLE 1

Single-pan Robot
pl w1 to LA1          (Atmospheric robot 76 fills the locks)
pl w2 to LA2
pl w3 to LA3
pl w4 to LA4 ---------> start LA phm
pl w5 to LB1
pl w6 to LB2

-continued

```
pl w7 to LB3
pl w8 to LB4 ---------->    start LB phm
pk w1 LA1                   (fill cluster pipeline)
pl w1 P1
pk w2 LA2
pl w2 P2
pk w3 LA3
pl w3 P3                    (pipeline full)
wait for P1 to finish
pk w1 P1
pl w1 LA3                   (same slot as the most recent input
                            substrate came from) Note that in an indexing
                            lock, this means no index is required between
                            pick and place at the load lock.
pk w4 LA4
pl w4 P1
wait for P2 to finish
pk w2 P2
pl w2 LA4
pk w5 LB1 ---------->       start F1 cycle for LA EVEN THOUGH
                            IT
                            HAS ONLY TWO SUBSTRATES because a
                            substrate was picked from the other
                            lock, refill LA with w9 and w10
pl w5 P2
wait for P3 to finish
pk w3 P3
pl w3 LB1
pk w6 LB2
pl w6 P3
wait for P1 to finish
pk w4 P1
pl w4 LB2
pk w7 LB3
pl w7 P1
wait for P2 to finish
pk w5 P2
pl w5 LB3
pk w8 LB4
pl w8 P2
wait for P3 to finish
pk w6 P3
pl w6 LB4 ---------->       start F1 cycle for LB because LB is
                            full, wait until LA F1 finishes (LA
                            has w9 in LA1 and w10 in LA2)
pk w9 LA1
pl w9 P3
wait for P1 to finish
pk w7 P1
pl w7 LA1
pk w10 LA2
pl w10 P1
No more substrates to pick - start pipeline drain
wait for P2 to finish
pk w8 P2
pl w8 LA2
wait for P3 to finish
pk w9 P3
pl w9 LA3
wait for P1 to finish
pk w10 P1
pl w10 LA4 ---------->      start F1 cycle for LA because LA is
                            full
```

EXAMPLE 2

```
Dual-pan robot
pl w1 to LA1                (Atmospheric robot 76 fills the locks)
pl w2 to LA2
pl w3 to LA3
pl w4 to LA4 ---------->    start LA phm
pl w5 to LB1
pl w6 to LB2
pl w7 to LB3
```

-continued

```
pl w8 to LB4 ---------->    start LB phm (locks full)
pk w1 LA1                   (fill cluster pipeline)
pl w1 P1
pk w2 LA2
pl w2 P2
pk w3 LA3
pl w3 P3
pk w4 LA4                   (pipeline full)
wait for P1 to finish
pk w1 PI
pl w4 P1
pk w5 LB1 ---------->       start LA F1 cycle because substrate
                            was picked from the other lock,
                            refill LA1 with w9 and LA2 with w10
pl w1 LB1                   (same slot as the most recent input
                            substrate came from)
wait for P2 to finish
pk w2 P2
pl w5 P2
pk w6 LB2
pl w2 LB2
wait for P3 to finish
pk w3 P3
pl w6 P3
pk w7 LB3
pl w3 LB3
wait far P1 to finish
pk w4 P1
pl w7 P1
pk w8 LB4
pl w4 LB4 ---------->       start LB F1 cycle because LB is full
wait for P2 to finish
pk w5 P2
pl w8 P2
pk w9 LA1
pl w5 LA1
wait for P3 to finish
pk w6 P3
pl w9 P3
pk w10 LA2
pl w6 LA2
wait for P1 to finish
pk w7 P1
pl w10 P1
No more substrates to pick - start pipeline drain
pl w7 LA3                   (fill slots in active lock)
wait for P2 to finish
pk w8 P2
pl w8 LA4 --------->        start LA F1 cycle because LA is full
wait for P3 to finish
pk w9 P3
wait for LB F1 to finish
pl w9 LB1
wait for P1 to finish
pk w10 P1
pl w10 LB2 ---------->      start LB F1 cycle because no more
                            unprocessed substrates in batch
```

Based on the preceding steps it will be appreciated that the rules for scheduling through two alternating pass through locks are:

1) It is preferred only for a dual-pan vacuum robot with 2 positions on the arms that carry the substrates, to swap at the lock (pick first, then place to the same slot);

2) Always put an output substrate to the same slot from which the most recent input substrate came, ELSE, put it in the next empty slot in the lock that the last output substrate went to, ELSE, put it in the next empty slot in the other lock;

3) As soon as the lock is filled with processed substrates,

OR as soon as the vacuum robot picks a substrate from the other lock (whichever comes first), OR if no more unprocessed substrates are in the batch, start the F1 cycle (vent, empty using a separate robot in an atmospheric buffer station and refill, pump, home, map).

The same algorithm can be used for transferring substrates from one cluster to another and with clusters that are non-vacuum or that have a controlled atmosphere such as an inert gas. It can also be used with more than two load locks and applied to other pass through modules, such as heaters or coolers connecting two chambers of a 2-TM (transport module) chamber cluster.

Figure 6:
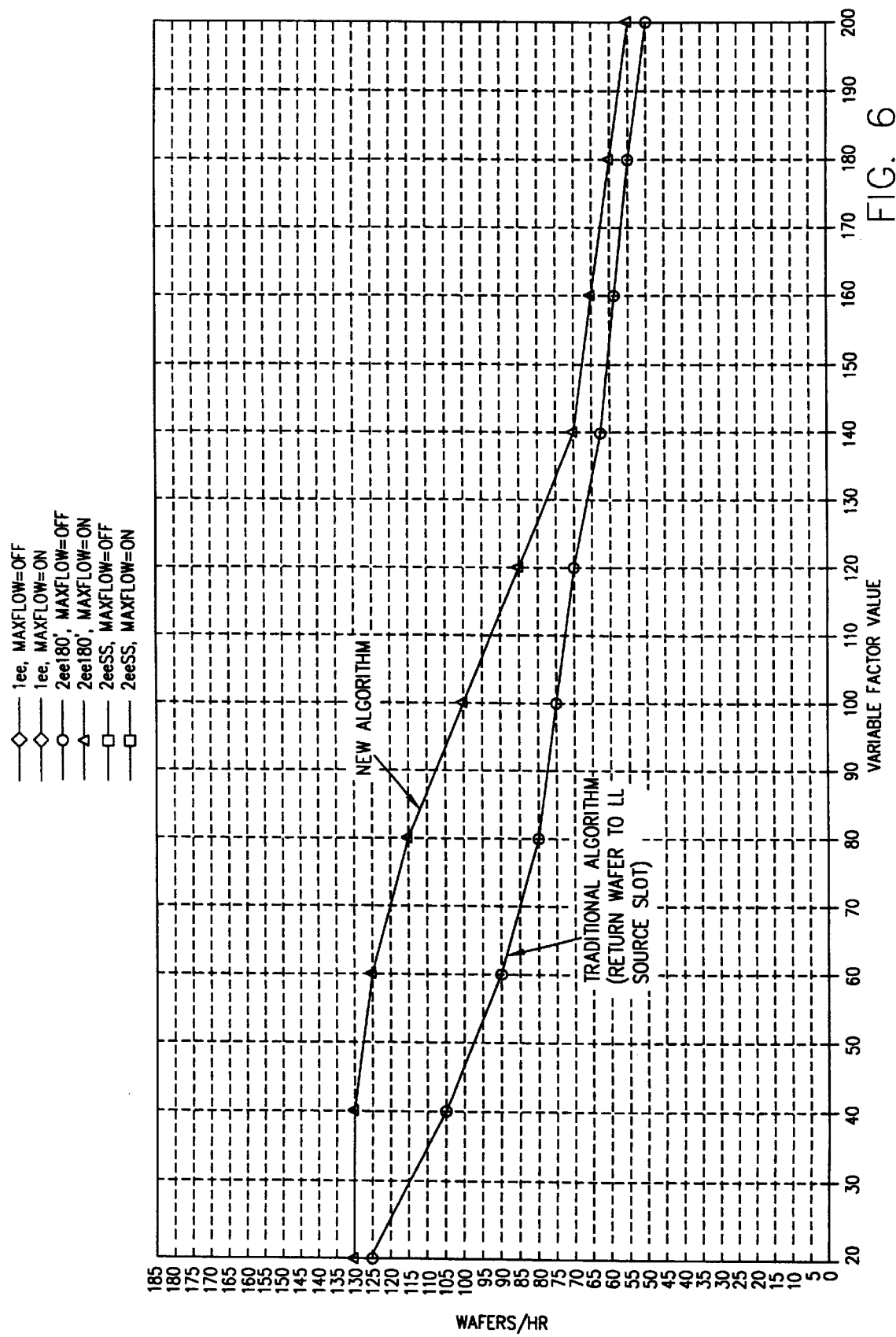
FIG. 6 is a plot illustrating a comparison of the throughputs (wafers/hr.) achievable with the system of the invention versus that achievable with the prior art systems wherein the substrates are returned to the same slots from which they are picked up.

It will be seen that unlike the operation of most prior art cluster tools, which use two load locks that each accept a full cassette (or SMIF pod) of wafers and wherein the substrates must return to the same cassette slots that they came from so that each ends up in its slot of origin, the present invention instead returns a substrate to the load lock slot of the substrate most recently sent into the tool for processing (although the external robot may still return the substrate to the cassette slot of origin). Also, venting is started on one lock as soon as the other lock becomes the substrate source rather than waiting until it has been refilled with processed substrates. Thus, the alternate load lock may be vented, refilled, and pumped down, much sooner than before, thereby maximizing throughput and eliminating indexing between the pick and place operations. A comparison of the throughputs (wafers/hr.) achievable with the system of the invention versus that achievable with the prior art systems wherein the substrates are returned to the same load lock slots is shown in FIG. 6.

As described above, the primary advantage of the present invention is the reduction in manufacturing costs by using lower cost load locks, but maintaining substantially the same throughput as prior art devices. Preferably, the lower cost load locks are non-indexing load locks. However, the method of the present invention could be used with any suitable type of load lock including load locks capable of indexing. The cost saving comes by providing a smaller volume load lock than would otherwise be necessary for a specific throughput with a large volume load lock not using the method of the invention. The invention can be used with a large capacity lock that is smaller than a full batch load lock and still have the same or faster throughput as the full batch load lock. If an indexing load lock is provided, one or both of the substrate transport robots can lack Z-motion capability.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method of transporting substrate into and out of a load lock having a plurality of substrate holding locations in a substrate processing apparatus, comprising the steps of:

removing a first substrate to be processed from a first substrate holding location in said load lock; and inserting a second substrate that has been processed into said first substrate holding location after said first substrate is removed and before any other substrates are inserted into or removed from said substrate holding location in said load lock.

2. The method of claim 1 wherein said load lock comprises a first load lock having a first plurality of substrate holding locations and further comprising a second load in said substrate processing apparatus having a second plurality of substrate holding locations wherein the plurality of substrate holding locations includes both the first and second plurality of substrate holding and wherein said first substrate comprises one of a plurality of first substrates being input for processing, and said second substrate comprises one of a plurality of second substrates being output after processing, and wherein said inserting step comprises:

always inserting said second substrate in a substrate holding location in said first load lock from which the most recently removed first substrate was removed, ELSE, said second substrate is inserted in the next substrate holding location in said first load lock to that in which the most recently inserted second substrate was inserted, ELSE, said second substrate is inserted in the next empty substrate holding location in said second load lock.

3. The method of claim 2 comprising the further step of:

as soon as the substrate holding locations in said first load lock are filled with second substrates, OR if no more second substrates remain to be inserted in said first load lock, beginning a cycle comprising the steps of emptying second substrates from the substrate holding locations in said first load lock and refilling them with first substrates.

4. The method of claim 1 wherein said substrate processing apparatus comprises at least two load locks, separating two different environments and having substrate support shelves defining said substrate holding locations, a robot in each environment for moving substrates into and out of the load locks, and a controller for controlling movement of the robots, and wherein said controller is programmed to perform the steps comprising:

causing one robot to move substantially all unprocessed substrates on the support shelves out of a first one of the load locks; and as soon as said one robot starts moving substrates on the support shelves out of a second one of the load locks, to start changing the environment of said first one of the load locks.

5. The method of claim 4 wherein said two different environments include a vacuum environment and an atmospheric pressure environment.

6. The method of claim 4 wherein said two different environments include an inert gas environment and an atmospheric pressure environment.

7. The method of claim 4 wherein said load locks are non-indexing load locks.

8. The method of claim 4 wherein said load locks are indexing load locks.

9. The method of claim 8 wherein at least one of said robots lacks Z-motion capability.

10. A method of transporting substrates for processing in a substrate processing apparatus having an atmospheric robot a controlled environment dual-pan robot, two pass through locks LA and LB with four shelf slots each LA1–LA4 and LB1–LB4, three parallel processing modules PM1, PM2, PM3, and ten substrates w1–w10 in a cassette to be processed, and wherein pk is "pick up", pl is "place", phm is "pump, home, map", and Fl cycle is "vent, empty and refill, pump, home, map", comprising the steps of:

using said atmospheric robot to fill the locks,

```
pl w1 to LA1
pl w2 to LA2
pl w3 to LA3
pl w4 to LA4 ---------->   start LA phm
pl w5 to LB1
pl w6 to LB2
pl w7 to LB3
pl w8 to LB4 ---------->   start LB phm
using said dual-pan robot begin filling processing modules
pk w1 LA1
pl w1 P1
pk w2 LA2
pl w2 P2
pk w3 LA3
pl w3 P3
pk w4 LA4
wait for P1 to finish
pk w1 P1
pl w4 P1
pk w5 LB1 ---------->   start LA F1 cycle, refill LA1 with w9
                        and LA2 with w10
pl w1 LB1
wait for P2 to finish
pk w2 P2
pl w5 P2
pk w6 LB2
pl w2 LB2
wait for P3 to finish
pk w3 P3
pl w6 P3
pk w7 LB3
pl w3 LB3
wait for P1 to finish
pk w4 P1
pl w7 P1
pk w8 LB4
pl w4 LB4 ---------->   start LB F1 cycle
wait for P2 to finish
pk w5 P2
pl w8 P2
pk w9 LA1
pl w5 LA1
wait for P3 to finish
pk w6 P3
pl w9 P3
pk w10 LA2
pl w6 LA2
wait for P1 to finish
pk w7 P1
pl w10 P1
No more substrates to pick - start pipeline drain
fill slots in active lock
pl w7 LA3
wait for P2 to finish
pk w8 P2
pl w8 LA4 ---------->   start LA F1 cycle
wait for P3 to finish
pk w9 P3
wait for LB F1 to finish
pl w9 LB1
wait for P1 to finish
pk w10 P1
pl w10 LB2 ---------->   start LB F1 cycle.
```

11. A method of transporting substrates for processing in a substrate processing apparatus having an atmospheric robot, a controlled environment single-pan robot, two pass through locks LA and LB with four shelf slots each LA1–LA4 and LB1–LB4, three parallel processing modules PM1, PM2, PM3, and ten substrates w1–w10 in a cassette to be processed, and wherein pk is "pick up", pl is "place", phm is "pump, home, map", and F1 cycle is "vent, empty and refill, pump, home, map", comprising the steps of:

using said atmospheric robot to fill the locks,

```
pl w1 to LA1
pl w2 to LA2
pl w3 to LA3
pl w4 to LA4 ---------->   start LA phm
pl w5 to LB1
pl w6 to LB2
pl w7 to LB3
pl w8 to LB4 ---------->   start LB phm
``` using said single-pan robot begin filling processing modules

```
pk w1 LA1
pl w1 P1
pk w2 LA2
pl w2 P2
pk w3 LA3
pl w3 P3
wait for P1 to finish
pk w1 P1
pl w1 LA3
pk w4 LA4
pl w4 P1
wait for P2 to finish
pk w2 P2
pl w2 LA4
pk w5 LB1 ---------->   start LA F1 cycle, refill LA1 with
                        w9 and LA2 with w10
pl w5 P2
wait for P3 to finish
pk w3 P3
pl w3 LB1
pk w6 LB2
pl w6 P3
wait for P1 to finish
pk w4 P1
pl w4 LB2
pk w7 LB3
pl w7 P1
wait for P2 to finish
pk w5 P2
pl w5 LB3
pk w8 LB4
pl w8 P2
wait for P3 to finish
pk w6 P3
pl w6 LB4 ---------->   start LB F1 cycle, wait until LA F1
                        finishes (LA1 has w9 and LA2 has w10)
pk w9 LA1
pl w9 P3
wait for P1 to finish
pk w7 P1
pl w7 LA1
pk w10 LA2
pl w10 P1
```

No more substrates to pick - start processing module drain

```
wait for P2 to finish
pk w8 P2
pl w8 LA2
wait for P3 to finish
pk w9 P3
pl w9 LA3
wait for P1 to finish
pk w10 P1
pl w10 LA4 ----------> start LA F1 cycle.
```

* * * * *

UNITED STATES PATENT AND TRADEMARK OFFICE
CERTIFICATE OF CORRECTION

PATENT NO. : 6,257,827 B1
DATED : July 10, 2001
INVENTOR(S) : Ruth Ann Henrickson and Peter F. Van der Meulen It is certified that error appears in the above-identified patent and that said Letters Patent is hereby corrected as shown below:

<u>Column 9, claim 2,</u>
Line 63, insert -- lock -- after load.
Line 67, insert -- locations -- after holding.

<u>Column 10, claim 10,</u>
Line 61, insert a -- , -- after robot.

Signed and Sealed this

Sixteenth Day of April, 2002

Attest:

JAMES E. ROGAN
*Attesting Officer*   *Director of the United States Patent and Trademark Office*

UNITED STATES PATENT AND TRADEMARK OFFICE
CERTIFICATE OF CORRECTION

PATENT NO. : 6,257,827 B1
DATED : July 10, 2001
INVENTOR(S) : Ruth Ann Henrickson and Peter F. Van der Meulen It is certified that error appears in the above-identified patent and that said Letters Patent is hereby corrected as shown below:

<u>Title page,</u>
Item [73], Assignee address "Chelmford" should read -- Chelmsford --.

Signed and Sealed this

Twenty-first Day of May, 2002

Attest:

JAMES E. ROGAN
*Director of the United States Patent and Trademark Office*

*Attesting Officer*